US011862462B2

(12) United States Patent
Reber et al.

(10) Patent No.: US 11,862,462 B2
(45) Date of Patent: Jan. 2, 2024

(54) METHOD AND APPARATUS FOR THE CONTINUOUS VAPOR DEPOSITION OF SILICON ON SUBSTRATES

(71) Applicant: NexWafe GmbH, Freiburg (DE)

(72) Inventors: Stefan Reber, Gundelfingen (DE); Kai Schillinger, Freiburg (DE)

(73) Assignee: Nexwafe GmbH, Freiburg (DE)

( * ) Notice: Subject to any disclaimer, the term of this patent is extended or adjusted under 35 U.S.C. 154(b) by 88 days.

(21) Appl. No.: 16/754,860

(22) PCT Filed: Oct. 25, 2018

(86) PCT No.: PCT/EP2018/079228
§ 371 (c)(1),
(2) Date: Apr. 9, 2020

(87) PCT Pub. No.: WO2019/081618
PCT Pub. Date: May 2, 2019

(65) Prior Publication Data
US 2021/0202237 A1 Jul. 1, 2021

(30) Foreign Application Priority Data
Oct. 27, 2017 (DE) .......................... 102017125232.0

(51) Int. Cl.
*H01L 21/02* (2006.01)
*C23C 16/24* (2006.01)
(Continued)

(52) U.S. Cl.
CPC .......... *H01L 21/0262* (2013.01); *C23C 16/24* (2013.01); *C23C 16/45593* (2013.01);
(Continued)

(58) Field of Classification Search
CPC ........... H01L 21/0262; H01L 21/02532; H01L 21/67017; C23C 16/24; C23C 16/45593; C23C 16/52
See application file for complete search history.

(56) References Cited

U.S. PATENT DOCUMENTS 8,900,368 B2    12/2014  Reber et al.
2004/0131528 A1*  7/2004  Kendig .................... C01B 33/03
                                                              423/350
(Continued)

FOREIGN PATENT DOCUMENTS

DE     102005045582     3/2007
EP     2036859          3/2009
(Continued)

OTHER PUBLICATIONS

Japanese Office Action dated Sep. 22, 2022 for Japanese Patent Application No. 2020-523815.

*Primary Examiner* — Kelly M Gambetta
(74) *Attorney, Agent, or Firm* — Volpe Koenig

(57) ABSTRACT

A method for the continuous vapour deposition of silicon on substrates, including the following steps: a) introducing at least one substrate into a reaction chamber; b) introducing a process gas and at least one gaseous silicon precursor compound into the reaction chamber; c) forming a gaseous mixture of at least one silicon-based intermediate product coexisting with the gaseous silicon precursor compound and the process gas; d) forming a silicon layer by vapour deposition of silicon from the gaseous silicon precursor compound and/or the silicon-based intermediate product on the substrate; e) discharging an excess of the gaseous mixture from the reaction chamber; f) returning at least one of the constituents of the excess of the gaseous mixture, selected from the silicon precursor compound, the silicon-based intermediate product and/or the process gas into the (Continued)

reaction chamber, wherein introducing the gaseous silicon precursor compound into the reaction chamber is regulated such that the molar ratio of the silicon-based intermediate product to the silicon precursor compound has a value of 0.2:0.8 to 0.5:0.5.

11 Claims, 3 Drawing Sheets

(51) Int. Cl.
- *C23C 16/455* (2006.01)
- *C23C 16/52* (2006.01)
- *H01L 21/67* (2006.01)

(52) U.S. Cl.
CPC ........ *C23C 16/52* (2013.01); *H01L 21/02532* (2013.01); *H01L 21/67017* (2013.01)

(56) References Cited

U.S. PATENT DOCUMENTS

| | | | | |
|---|---|---|---|---|
| 2008/0317956 | A1* | 12/2008 | Reber | C23C 16/453 |
| | | | | 118/733 |
| 2009/0060822 | A1* | 3/2009 | Shimizu | C23C 16/24 |
| | | | | 423/349 |
| 2011/0174775 | A1 | 7/2011 | Umeoka et al. | |

FOREIGN PATENT DOCUMENTS

| | | |
|---|---|---|
| EP | 2239353 | 10/2013 |
| JP | H07-277720 A | 10/1995 |
| JP | 2004-071970 A | 3/2004 |
| JP | 2009-062209 A | 3/2009 |
| JP | S5964516 B2 | 8/2016 |
| WO | 2014/028225 A1 | 2/2014 |

* cited by examiner

METHOD AND APPARATUS FOR THE CONTINUOUS VAPOR DEPOSITION OF SILICON ON SUBSTRATES

BACKGROUND

Chemical vapor deposition of silicon on substrates makes it possible to produce silicon layers having a layer thickness of from 1 to 200 μm, which are employed in solar cells and in microelectronics. In contrast to the conventional production process involving sawing of silicon blocks from the Czochralski- or zone melting-process, sawing losses are avoided in chemical vapor deposition. In addition, large quantities of silicon and thus considerable costs can be saved due to the small layer thickness compared to conventionally produced silicon wafers having a layer thickness in the range from 200 to 300 μm.

In chemical vapor deposition, a substrate is introduced into a reaction chamber and heated to from 700° C. to 1400° C. A silicon precursor compound is then fed into the reaction chamber and decomposes thermally in the reaction chamber, as a result of which solid silicon deposits on the substrate. Possible by-products of this chemical reaction and also the excess of the silicon precursor compound are conveyed out of the reaction chamber. Chemical vapor deposition enables not only polycrystalline but also monocrystalline silicon layers to be produced by chemical vapor-phase epitaxy on crystalline substrates.

Suitable silicon precursor compounds are, inter alia, silanes and chlorosilanes, but the use of silanes is disadvantageous because of their spontaneous flammability in contact with atmospheric oxygen and also the tendency to undergo gas phase nucleation. In the case of chlorosilanes, the silicon deposition reaction on the substrate is carried out in the presence of hydrogen as process gas and proceeds according to the simplified reaction equation:

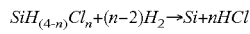
$SiH_{(4-n)}Cl_n + (n-2)H_2 \rightarrow Si + nHCl$

Here, it has been found that silicon tetrachloride (n=4) is thermally stable up to 1600° C. Only after addition of hydrogen does deposition of silicon on the substrate occur. However, gaseous lower chlorosilanes are additionally formed in the reaction chamber or during cooling after passing through the reaction chamber, for example trichlorosilane (n=3) and dichlorosilane (n=2) depending on $H_2$ concentration, temperature and pressure, according to:

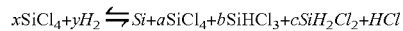
$xSiCl_4 + yH_2 \rightleftharpoons Si + aSiCl_4 + bSiHCl_3 + cSiH_2Cl_2 + HCl$ These intermediates likewise decompose thermally and lead to deposition of silicon at significantly lower temperatures from 700° C. This leads to deposition of silicon not only on the substrate surface but also in the gas feed and discharge conduits of the reaction chamber. These "parasitic" deposits lead to a reduction in the cross section of these fluid conduits and therefore have to be removed regularly in order to maintain all cross sections.

DE 10 2005 045 582 describes, for example, a process for the continuous vapor deposition of silicon on substrates, in which parasitic deposits in the apparatus are removed and/or the formation thereof is prevented by periodically changing the composition of the gas fed in, while at the same time maintaining deposition of silicon on the substrates. For this purpose, a corrosive gas, namely hydrogen chloride, which serves to remove parasitic deposits is fed into the reaction chamber at periodic intervals. Such a process has the disadvantage that the throughput of substrates coated with silicon decreases significantly in the presence of the corrosive gas, since any solid silicon, i.e. not only the parasitic deposits, is converted into gaseous trichlorosilane in the presence of hydrogen chloride. This leads to a reduction in the layer thickness of the silicon layer and also increases the use of further gas the production costs.

SUMMARY

It is therefore an object of the present invention to provide a process and an apparatus for the vapor deposition of silicon on substrates, by which the formation of parasitic deposits can be prevented or at least reduced and the throughput can be increased compared to the processes known from the prior art.

This object is achieved by a process and by an apparatus having one or more features disclosed herein.

Advantageous further developments of the inventive concept are described below and in the claims.

The invention relates to a process for the continuous vapor deposition of silicon on substrates. The invention further relates to an apparatus for the continuous vapor deposition of silicon on substrates.

The process of the invention for the continuous vapor deposition of silicon on substrates comprises the following process steps:

In a process step (a), at least one substrate is introduced into a reaction chamber. In a process step (b), a process gas and at least one gaseous silicon precursor compound are introduced into the reaction chamber. A gaseous mixture of at least one silicon-based intermediate is then formed in coexistence with the gaseous silicon precursor compound and the process gas in the reaction chamber in a process step (c). In the subsequent process step (d), a silicon layer is formed on the substrate by vapor deposition of silicon from the silicon precursor compound and/or the silicon-based intermediate. In a process step (e), an excess of the gaseous mixture is discharged from the reaction chamber.

In the process of the invention, it is important that at least one of the constituents of the excess of the gaseous mixture, selected from among the silicon precursor compound, the silicon-based intermediate and/or the process gas, is recirculated into the reaction chamber in process step (f), where the introduction of the silicon precursor compound into the reaction chamber in the process is regulated in such a way that the molar ratio of the silicon-based intermediate to the silicon precursor compound has a value of from 0.2:0.8 to 0.5:0.5, preferably from 0.3:0.7 to 0.5:05, particularly preferably 0.5:0.5, in the process gas. The silicon precursor compound is thus present in an excess over or in the same amount as the silicon-based intermediate in the gas stream flowing into the reaction chamber.

Within the scope of the invention, the substrate is composed of polycrystalline or single-crystal silicon, ceramic, glass and/or composites or laminates thereof. However, the invention is not restricted thereto since, for example, polymer-containing substrates or other semiconductor materials, e.g. silicon carbide, or other compound semiconductors are also conceivable.

Since always less than 100%, typically from 15% to 30%, of the silicon precursor compound used is converted into solid silicon in the production of silicon layers on substrates by chemical vapor deposition, the recirculation of at least one of the constituents of the excess of the gaseous mixture makes it possible to achieve not only a significant reduction in environmentally polluting waste materials but also a reduction in the process costs due to a lower consumption of the silicon precursor compound.

Furthermore, the invention is based on the recognition that the deposition of silicon is not only temperature-dependent but also dependent on the molar composition of the gaseous mixture which is composed of the at least one silicon-based intermediate, the silicon precursor compound and the process gas. Studies carried out by the applicant have shown that the choice of a suitable molar ratio of the silicon-based intermediate and the silicon precursor compound inhibits or completely prevents the deposition of silicon. This recognition is based on the fact that chemical vapor deposition of silicon from silicon precursor compounds and/or silicon-based intermediates tends to proceed as an equilibrium reaction which is temperature- and concentration-dependent. Especially at a molar ratio of the silicon-based intermediate and silicon precursor compound of from 0.2:0.8 to 0.5:0.5, the parasitic deposition can be largely prevented. At a molar ratio of the silicon-based intermediate and the silicon precursor compound of from 0.3:0.7 to 0.5:0.5, the parasitic deposition can even be prevented completely. Such a molar ratio can be set by controlled introduction of the silicon precursor compound and also recirculation of at least one of the constituents of the excess of the gaseous mixture, selected from among the silicon precursor compound, the silicon-based intermediate and/or the process gas, into the gas feed conduit to the reaction chamber.

It is generally known that the deposition rate of solid silicon on substrates during chemical vapor deposition also depends on the composition of the gas stream fed into the reaction chamber. In order to optimize the deposition rate of silicon, preference can therefore be given in process step (b) to introducing not only one but a plurality of silicon precursor compounds into the deposition chamber. If a plurality of silicon precursor compounds are introduced into the gas feed conduit to the reaction chamber, the molar ratio indicated relates to one of the silicon precursor compounds. Within the scope of the invention, a plurality of chlorosilanes, in particular silicon tetrachloride and trichlorosilane, can be introduced as silicon precursor compounds in process step (b). In this case, the molar ratio preferably relates to the higher chlorosilane relative to the silicon-based intermediate.

Due to the formation of the gaseous mixture composed of at least one silicon-based intermediate, the silicon precursor compound and the process gas in the reaction chamber in process step (c) and the subsequent deposition of silicon in process step (d), the composition of the discharged excess of the gaseous mixture can be predicted only imprecisely. For this reason, a determination of the molar ratio of the silicon-based intermediate and the silicon precursor compound in the excess of the gaseous mixture is, in a first advantageous embodiment of the process carried out by a measuring unit in step (f).

Within the scope of the invention, this measuring unit can be configured directly for determining the molar ratio or for determining an equivalent parameter, in particular the concentration and/or the amount and/or the volume or mass flow of one and/or more silicon-based intermediates, from which the molar ratio of the silicon-based intermediate and the silicon precursor compound in the excess of the gaseous mixture can be derived. However, as an alternative, the measuring unit can also serve to determine the molar ratio of the silicon-based intermediate and the silicon precursor compound in the excess of the gaseous mixture directly. Furthermore, the measuring unit can serve for on-line determination of the relevant molar ratio or the concentration of one and/or more silicon-based intermediates. As an alternative, the measuring unit can also serve only at certain times for determining the relevant molar ratio or the concentration of one and/or more silicon-based intermediates, for example at the beginning of the chemical vapor deposition and/or after particular time intervals. However, the invention is not restricted thereto.

In a further advantageous embodiment of the process, the molar ratio of the silicon-based intermediate to the silicon precursor compound which has been determined by the measuring unit is transmitted to a control unit which controls the introduction of the silicon precursor compound in such a way that the molar ratio of the silicon-based intermediate to the silicon precursor compound has a value of from 0.2:0.8 to 0.5:05, preferably from 0.3:0.7 to 0.5:05, particularly preferably 0.5:0.5, in the process gas.

The transmission of the molar ratio determined by the measuring unit can be carried out automatically, in particular via data line or wirelessly, or manually by a user who reads off the result from the measuring unit and passes on this information to the control unit. The subsequent introduction of the silicon precursor compound by the control unit can likewise be carried out automatically or manually by the user. Here, it is within the scope of the invention for the control unit to be configured as flow regulator. However, the invention is not restricted thereto. However, automatic regulation has considerable advantages in respect of process reliability and a reduced workload.

In order to be able to carry out the chemical vapor deposition of solid silicon on a substrate as a continuous process, a significant role is played not only by the molar ratio of the silicon-based intermediate to the silicon precursor compound in the gas stream flowing into the reaction chamber but also the total amount of the silicon precursor compound and the silicon-based intermediate. A drop in the total amount below a specific value leads to a decrease in the deposition rate of solid silicon. The reason for this is that the deposition of silicon proceeds as an equilibrium reaction. It is therefore advantageous for this total amount to be kept constant during introduction into the reaction chamber in order to create optimal conditions for the deposition of solid silicon. This is advantageously achieved by the inflow of process gas preferably being kept constant, while the silicon-based intermediate and the silicon precursor compound are introduced in a metered manner such that firstly the desired molar ratio of the two compounds relative to one another is set, and that secondly the desired total amount of the two compounds is achieved. If, for example, an excessive amount of the silicon-based intermediate is detected by the measuring unit, this intermediate can also be discharged from the apparatus in order for a maximum total amount in the reaction chamber not to be exceeded.

Furthermore, an advantageous embodiment of the process of the invention provides for the excess of the gaseous mixture in step (f) to be freed of impurities. In order for the recirculation of one or more constituents of the excess of the gaseous mixture in step (f) also to be made possible, the process can, in a preferred embodiment, provide a recovery unit which at least partly separates the excess of the gaseous mixture in step (f). Such a recovery unit thus allows not only the recirculation of a desired constituent of the excess of the gaseous mixture but also the removal of undesirable by-products of the deposition of silicon.

In a further preferred embodiment of the process, the silicon-based intermediate and/or the silicon precursor compound and/or the process gas is recirculated into the reaction chamber in step (f).

In a further advantageous embodiment of the process, the silicon precursor compound is a chlorosilane, preferably silicon tetrachloride and/or trichlorosilane.

As explained above, the rate of deposition of silicon can preferably be optimized by not only one but a plurality of silicon precursor compounds being introduced into the deposition chamber in process step (b). If a plurality of silicon precursor compounds are introduced into the reaction chamber, the silicon precursor compounds are preferably silicon tetrachloride and trichlorosilane.

Compared to other commercially available silanes, for example disilane or trisilane, chlorosilanes are significantly cheaper and less hazardous to handle because they do not, inter alia, display spontaneous ignition in the presence of atmospheric oxygen. In addition, the use of chlorosilanes makes possible a significantly higher deposition rate so as to achieve a high layer quality compared to the silanes mentioned, as a result of which the throughput of silicon-coated substrates is significantly increased.

It generally known that when trichlorosilane is used as precursor compound, it is possible to achieve high deposition rates of silicon in the range from 1 µm/min to 15 µm/min on substrates, with deposition of silicon occurring at temperatures as low as 700° C. However, a disadvantage here is that a significant increase in parasitic deposits in the gas conduits of the reaction chamber occurs at these or higher temperatures. In contrast thereto, pure silicon tetrachloride is stable up to about 1600° C. However, the deposition rate is significantly lower because of the lower silicon to chlorine ratio.

Studies carried out by the applicant have shown that the use of silicon tetrachloride in the presence of trichlorosilane leads to an optimized deposition rate while at the same time avoiding parasitic deposits.

Since silicon tetrachloride is thermally stable up to a temperature of 1600° C. and the deposition of silicon at lower temperatures proceeds only in the presence of hydrogen, a further advantageous embodiment provides for the process gas to be hydrogen.

In a further advantageous embodiment of the process of the invention, the silicon-based intermediate is a chlorosilane, preferably trichlorosilane.

As explained above, a plurality of silicon precursor compounds can advantageously be fed into the reaction chamber in process step (b), with the silicon precursor compounds preferably being silicon tetrachloride and trichlorosilane. It may be pointed out that in this case trichlorosilane is firstly introduced as silicon precursor compound into the reaction chamber and secondly can also be recirculated as intermediate into the reaction chamber in process step (f).

In order to achieve optimal deposition of silicon on the substrate and at the same time minimize the process costs, an advantageous embodiment of the process provides for a total amount of silicon-based precursor compound and silicon-based intermediate to be present in a molar ratio of from 1 to 10 mol %, preferably from 2 to 7 mol %, particularly preferably from 3 to 6 mol %, in the process gas in step (c).

In a further advantageous embodiment of the process, the formation of a silicon layer by chemical vapor deposition of silicon from the on silicon precursor compound and/or from the silicon-based intermediate on the substrate takes place at a pressure of from 0.8 bar to 1.2 bar in the reaction chamber.

Carrying out the process of the invention at approximately atmospheric pressure is therefore within the scope of the invention. This avoids time-consuming establishment of vacuum conditions in the reaction chamber, as a result of which the throughput of silicon-coated substrates can be significantly increased.

Since the rate of deposition of silicon on the substrate is highly temperature dependent, at least the substrate is, in a further advantageous embodiment of the process of the invention, heated to a temperature of from 700° C. to 1400°, preferably to from 1000° C. to 1300° C., particularly preferably to from 1100° C. to 1200° C., in the reaction chamber. The heating of the substrate to a particular temperature thus makes it possible to set the deposition rate of silicon on the substrate in a targeted manner.

Within the scope of the invention, not only the substrate but also the reaction chamber and/or the gas conduits assigned to the reaction chamber can be heated. Here, the substrate and/or the reaction chamber and/or the gas conduits can each be heated to different temperatures. This allows optimal introduction of gas into the reaction chamber and also gas recirculation.

A further aspect of the present invention is an apparatus for the continuous vapor deposition of silicon on substrates, in particular for carrying out a process as described herein, comprising: a reaction chamber which comprises at least one inlet opening and at least one outlet opening for substrates, a transport device for transporting the substrates through the reaction chamber from the inlet opening to the outlet opening, at least two gas inlets for feeding a gas into the reaction chamber, at least one gas outlet for discharging the gas from the reaction chamber, at least two fluid feed conduits, preferably gas feed conduits, which fluid feed conduits are connected to two of the gas inlets of the reaction chamber.

The gas inlets serve for introducing the process gas, the silicon-based intermediate and/or the silicon precursor compound into the reaction chamber.

It is important here that the apparatus of the invention comprises at least one control unit and that a circulation conduit is arranged between the gas outlet and the gas inlet of the reaction chamber, which circulation conduit is connected to the fluid feed conduit and also the gas outlet of the reaction chamber, where the apparatus comprises at least one measuring unit for determining a molar ratio of the silicon-based intermediate and the silicon precursor compound and/or a parameter equivalent thereto and where the control unit and the measuring unit are configured so as to interact in such a way that a flow through the feed conduits can be controlled or regulated by the control unit on the basis of a signal transmitted from the measuring unit to the control unit.

As mentioned above, it is within the scope of the invention for the measuring unit to be configured for determining the concentration and/or the amount and/or the volume or mass flow of one and/or more silicon-based intermediates, from which the molar ratio of the silicon-based intermediate and/or the silicon precursor compound in the excess of the gaseous mixture can be derived. However, as an alternative, the measuring unit can also serve to determine the molar ratio of the silicon-based intermediate and the silicon precursor compound in the excess of the gaseous mixture directly. Furthermore, the measuring unit is configured for on-line determination of the relevant molar ratio or the concentration of one and/or more silicon-based intermediates. As an alternative, the measuring unit can also serve to determine the relevant molar ratio or the concentration of one and/or more silicon-based intermediates for only part of the time, for example at the beginning of the chemical vapor deposition and/or after particular time intervals. However, the invention is not restricted thereto. However, automatic regulation has considerable advantages in respect of process reliability and a reduced workload.

Such an apparatus allows continuous transport of substrates into the reaction chamber, with the substrates being transported by the transport device from the inlet opening of the reaction chamber to the outlet opening. The gas inlets of the apparatuses according to the invention serve for introduction of the process gas, the silicon precursor compound and for recirculated constituents of the excess of the gaseous precursor compounds after they have been discharged from the reaction chamber.

In a first preferred embodiment of the apparatus of the invention, the measuring unit is arranged on the circulation conduit.

Within the scope of the invention, the measuring unit can either be integrated into the circulation conduit or be arranged on the circulation conduit. If the measuring unit is integrated into the circulation conduit, the determination of the molar ratio of the silicon-based intermediate and the silicon precursor compound is carried out on-line. This measurement can be carried out continuously or at time intervals preset by the user. If the measuring unit is arranged on the circulation conduit, the measurement of the molar ratio of the silicon-based intermediate and the silicon precursor compound is carried out either by automatic introduction of a sample or after sampling by the user who manually introduces the sample the of the excess of the gaseous mixture into the measuring unit. However, the invention is not restricted thereto.

In a further preferred embodiment of the apparatus of the invention, the measuring unit is configured as a spectrometer or as a mass flow meter, for example a Coriolis mass flow meter, or as a volume flow meter.

If a silicon precursor compound which is liquid at room temperature and/or a silicon-based intermediate which is liquid at room temperature is/are used, at least one of the fluid feed conduits has, in an advantageous embodiment of the apparatus, a vaporizer which brings the silicon precursor compound and/or the silicon-based intermediate into the gaseous state.

In a further preferred embodiment of the apparatus of the invention, the circulation conduit has a recovery unit which serves for separation of the excess of the gaseous mixture discharged from the reaction chamber and recovery of the silicon precursor compound and/or the silicon-based intermediate and/or the process gas.

In a further advantageous embodiment of the apparatus of the invention, this recovery unit is configured as distillative separation apparatus and/or dry absorber or adsorber. The hydrogen chloride formed in the chemical vapor deposition of solid silicon and/or the silicon precursor compound can be separated off by the dry absorber or adsorber in the recirculation of the excess of the gaseous mixture.

Constituents of the gaseous excess are advantageously recirculated separately since this makes separate regulation and/or utilization possible. In order to recirculate the silicon precursor compound and/or the silicon-based intermediate and/or the process gas separately after they have been separated by, for example, a distillative separation apparatus, the circulation conduit preferably has a plurality of subconduits between the recovery unit and the fluid feed conduit, which subconduits serve for the separate recirculation of the process gas, of the silicon-based intermediate and/or of the silicon precursor compound, where each subconduit has a separate measuring unit for determining the mass flow and/or volume flow of the process gas, of the silicon-based intermediate and/or of the silicon precursor compound.

It is within the scope of the invention for the process gas and/or the silicon-based intermediate and/or the silicon precursor compound to be discharged from the apparatus after they have been separated. For this purpose, the gas scrubber and/or the distillative separation apparatus can, for example, have a gas outlet which is connected to a gas discharge conduit. However, the invention is not restricted thereto since such a gas outlet with gas discharge conduit can also be arranged on the circulation conduit in the region of the measuring unit. However, it is advantageous to recirculate at least the constituents of the silicon-based intermediate in order to reduce the process costs. It is likewise advantageous for this reason to recirculate the process gas, in particular the hydrogen.

BRIEF DESCRIPTION OF THE DRAWINGS

Further advantageous properties of the invention can be derived from the following description of working examples with the aid of the drawing. The drawings show.

DETAILED DESCRIPTION

Figure 1:
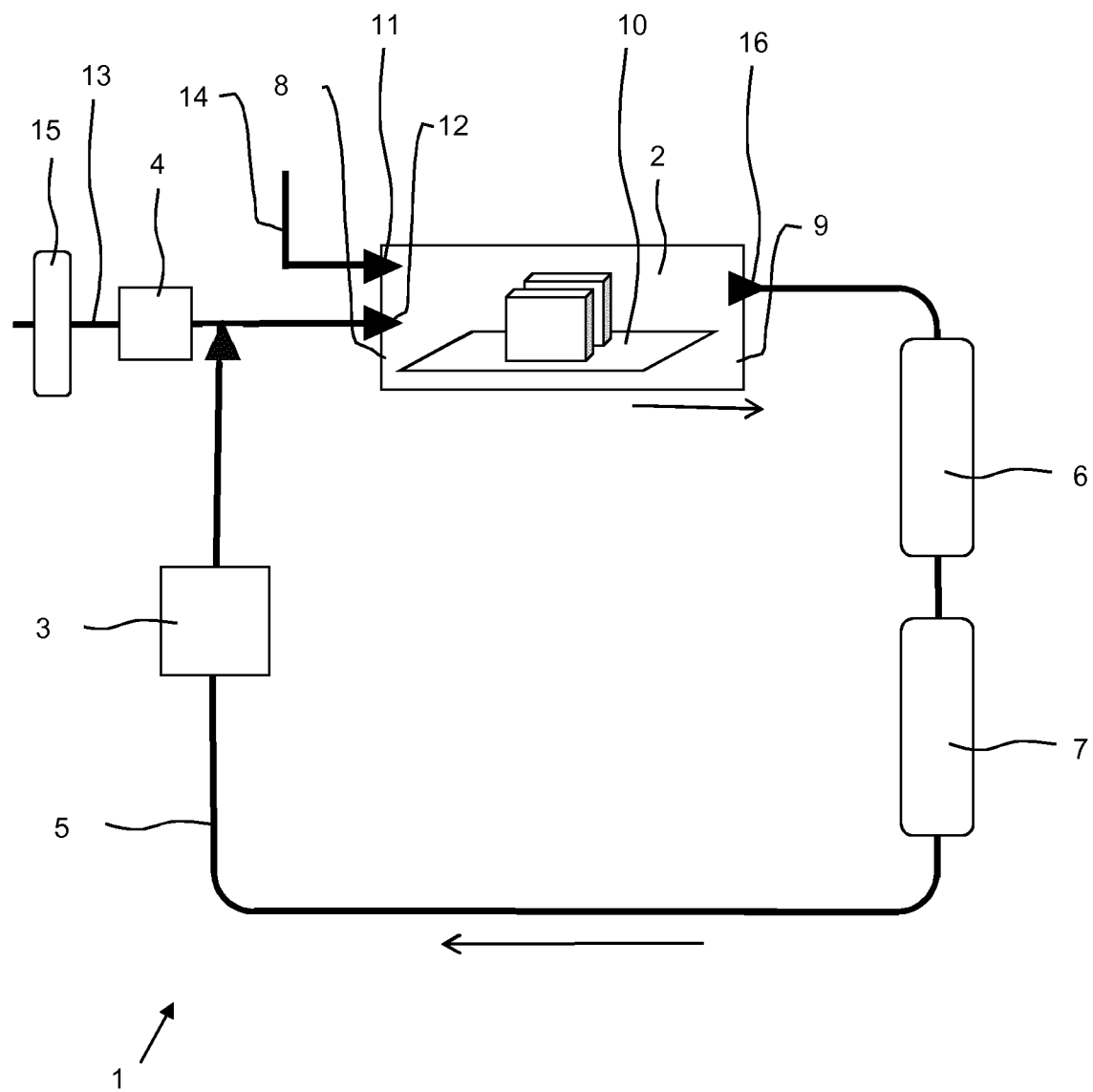
FIG. 1 a schematic depiction of a first working example of an apparatus according to the invention for the continuous vapor deposition of silicon on substrates, FIG. 2 a schematic depiction of a second working example of an apparatus according to the invention for the continuous vapor deposition of silicon on substrates, and FIG. 3 a schematic depiction of a third working example of an apparatus according to the invention for the continuous vapor deposition of silicon on substrates.

FIG. 1 shows a first working example of an apparatus 1 according to the invention for the continuous vapor deposition of silicon on substrates. This apparatus 1 comprises a reaction chamber 2, a measuring unit 3, a control unit 4, a circulation conduit 5, a gas scrubber 6 and a recovery unit 7.

The reaction chamber 2 has an inlet opening 8 through which substrates to be coated can be introduced into the reaction chamber 2. Furthermore, there is an outlet opening 9 on the side of the reaction chamber 2 opposite the inlet opening 8, via which outlet opening 9 silicon-coated substrates can be discharged from the reaction chamber 2. Transport of the substrates into the reaction chamber 2 and out again is effected by a transport device 10. As indicated by an arrow in FIG. 1, the transport device 10 has a transport direction for the substrates from the inlet opening 8 to the outlet opening 9. The transport device 10 can be configured as a conveyor belt. As an alternative, the transport device 10 can also have a plurality of transport rollers, or be configured as sliding rail transport.

As shown in FIG. 1, two substrates can in each case be introduced in an upright position into the reaction chamber 2 by the transport device 10. Here, the substrates are arranged parallel to one another, so that the sides to be coated of the substrates are opposite one another. Furthermore, the reaction chamber 2 has a temperature of 1100° C. in the present working example.

To introduce a gaseous silicon precursor compound and a process gas, two gas inlets 11, 12, via which the gaseous silicon precursor compound and the process gas can be introduced separately from one another into the reaction chamber, are arranged on the reaction chamber 2 in the region of the inlet opening 8. In the present working example, high-purity hydrogen is used as process gas. The formation of parasitic deposits in the gas inlets 11, 12 can be prevented by separate introduction of the gaseous silicon precursor compound and the process gas.

Furthermore, the gas inlets 11, 12 are each connected to a fluid feed conduit 13, 14 through which the silicon precursor compound and the process gas can be fed to the gas inlets 11, 12. In the present working example, silicon tetrachloride is used as silicon precursor compound. Since silicon tetrachloride has a boiling point of 57.6° C. and is thus liquid at room temperature, a vaporizer 15 is arranged on the fluid feed conduit 13. Liquid silicon tetrachloride is brought into the gaseous state by the vaporizer 15 before it is introduced into the reaction chamber 2.

In order to be able to discharge the excess of the gas mixture composed of the excess silicon precursor compound, the silicon-based intermediate and the process gas from the reaction chamber 2 after the substrates have been coated with silicon, the reaction chamber 2 has a gas outlet 16 in the region of the outlet opening 9. The gas outlet 16 is connected to the circulation conduit 5 which serves for recirculation of at least one of the constituents of the excess of the gaseous mixture, selected from among the silicon precursor compound, the silicon-based intermediate and/or the process gas, into the reaction chamber 2. Furthermore, the circulation conduit 5 is connected to the fluid feed conduit 13.

In the present working example, the gas scrubber 6, the recovery unit 7 and the measuring unit 3 are arranged on the circulation conduit 5 and are connected to one another via the continuous circulation conduit 5, in fact from the side of the gas outlet 16 to the side of the fluid feed conduit 13.

The gas scrubber 6 serves to concentrate the discharged excess of the gaseous mixture from the reaction chamber by bringing the discharged gaseous excess into contact with a scrubbing liquid in the gas scrubber 6, as a result of which valuable constituents of the excess can be taken up in the scrubbing liquid. The constituents going over can be solid, liquid or gaseous materials. As scrubbing liquid, it is possible to use, for example, chlorosilane.

The purified excess of the gaseous mixture can be conveyed via the circulation conduit 5 into the recovery unit 7. In the present working example, the recovery unit 7 is configured as distillative separation apparatus. It serves to separate the silicon precursor compound and/or the silicon-based intermediate from the process gas. In addition, the recovery unit 7 makes it possible to separate undesirable by-products of the chemical vapor deposition from the circulation conduit 5.

The measuring unit 3 is arranged on the circulation conduit 5 in order to determine a molar ratio of the silicon-based intermediate and the silicon precursor compound. In the present example, the measuring unit 3 is configured as infrared spectrometer which measures a concentration of the silicon-based intermediate and the silicon precursor compound in the gas stream of the circulation conduit 5 and in this way determines the molar ratio of the silicon-based intermediate and the silicon precursor compound. However, as an alternative, the measuring unit 3 can also be configured as Coriolis mass flow meter. However, the invention is not restricted thereto.

In order to regulate the introduction of the silicon precursor compound into the reaction chamber 2, a control unit 4, which can be configured, for example, as gas flow regulator, is arranged on the fluid feed conduit 13. The control unit 4 additionally serves to control the molar ratio of the silicon-based intermediate to the silicon precursor compound in the reaction chamber 2 during introduction. For this purpose, the control unit 4 is connected to the measuring unit 3.

A molar ratio of the silicon-based intermediate to the silicon precursor compound in the excess of the gaseous mixture in the circulation conduit 5 as determined by the measuring unit 3 is transmitted to the control unit 4. In order to maintain a desired molar ratio of the silicon-based intermediate to the silicon precursor compound of from 0.2:0.8 to 0.5:0.5, preferably from 0.3:0.7 to 0.5:0.5, particularly preferably 0.5:0.5, in the process gas in the reaction chamber 2, the control unit 4 controls the amount of silicon precursor compound fed via the fluid feed conduit 13 and the gas inlet 12 into the reaction chamber on the basis of the molar ratio of the silicon-based intermediate to the silicon precursor compound in the excess of the gaseous mixture in the circulation conduit 5 determined by the measuring unit 3. In the present working example, the control unit 4 and the measuring unit 3 are electrically conductively connected to one another, as a result of which the values measured by the measuring unit 3 are automatically transmitted to the control unit 4. However, it is also within the scope of the invention for a user of the apparatus 1 to read off the molar ratio determined by the measuring unit 3 and provide it manually to the control unit 4.

Figure 2:
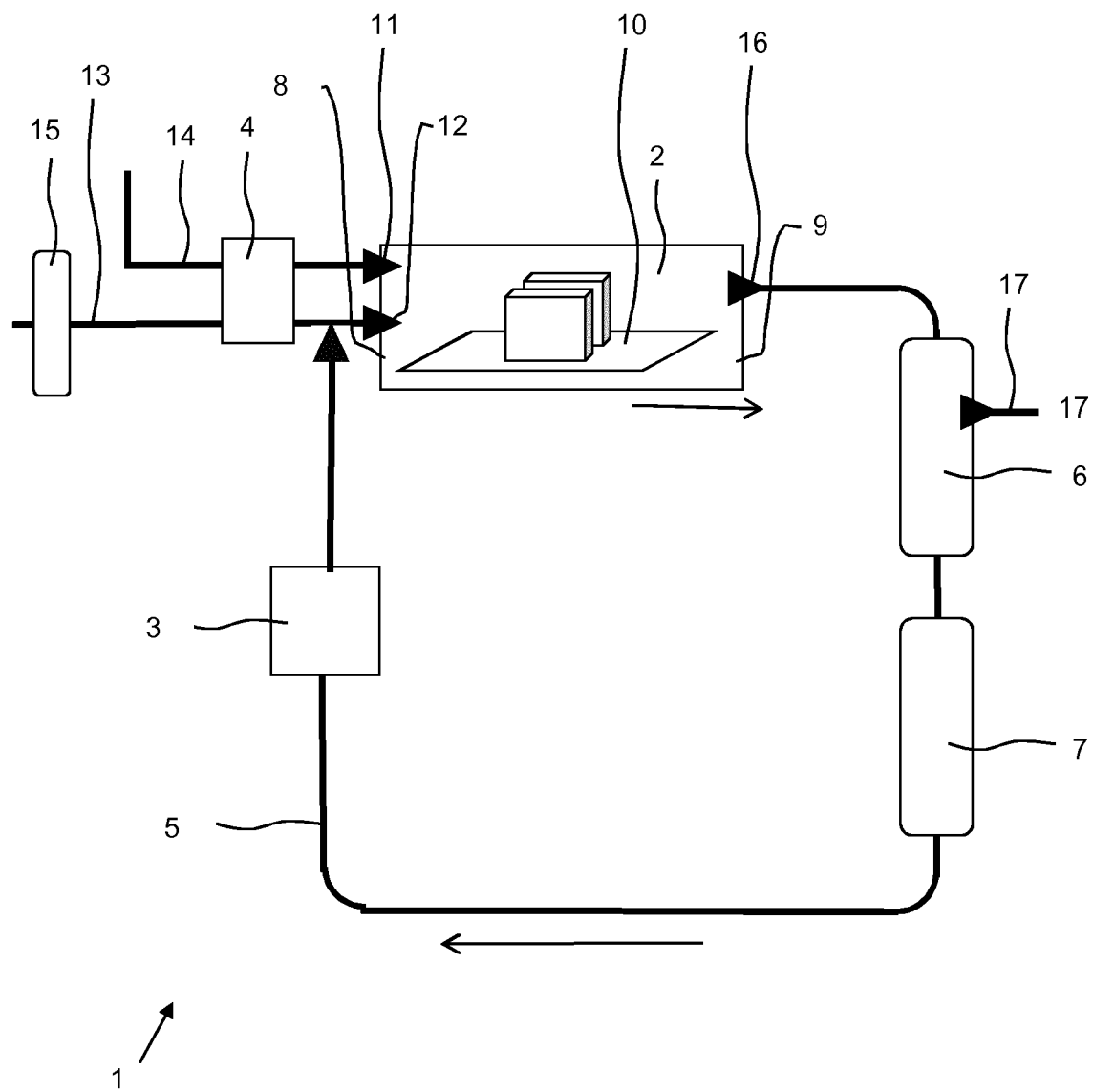

FIG. 2 shows a second working example of an apparatus 1 according to the invention for the continuous vapor deposition of silicon on substrates. The apparatus 1 has a structure which is largely identical to the configuration described in FIG. 1, for which reason further details will not be discussed first.

In order to regulate the introduction of the silicon precursor compound and of the process gas into the reaction chamber 2, the control unit 4 is arranged on the fluid feed conduit 13, 14. The control unit 4 serves firstly to control the molar ratio of the silicon-based intermediate to the silicon precursor compound in the reaction camber 2 during introduction and secondly to set a total amount of the silicon precursor compound and the silicon-based intermediate in step (c) in a molar ratio of from 1 to 10 mol %, preferably from 2 to 7 mol %, particularly preferably from 3 to 6 mol %, in the process gas. In this working example, too, the control unit 4 is connected to the measuring unit 3.

It is also within the scope of the invention for the excess process gas and/or the silicon-based intermediate and/or the silicon precursor compound to be discharged from the apparatus. In this present working example, the gas scrubber has, for this purpose, a gas outlet 17 with a discharge conduit 18 through which the excess process gas is discharged. However, the invention is not restricted thereto. Furthermore, the distillative separation apparatus can also have a gas outlet with a discharge conduit.

Figure 3:
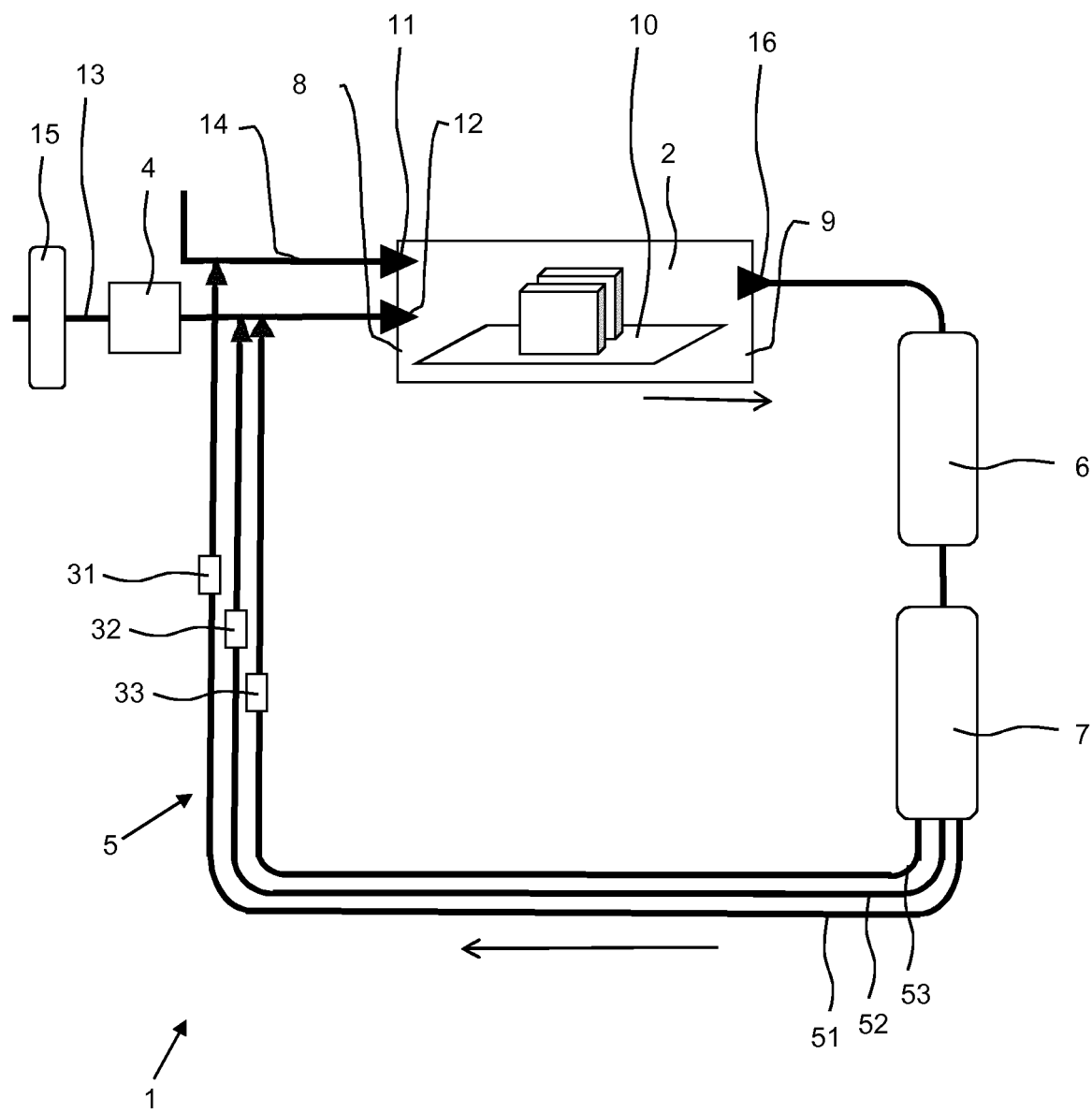

FIG. 3 shows a third working example of an apparatus 1 according to the invention for the continuous vapor deposition of silicon on substrates. This apparatus 1, too, has a structure which is largely identical to the configuration described in FIG. 1, for which reason further details will not be discussed first.

Downstream of the recovery unit 7, the circulation conduit 5 is split up into three separate subconduits 51, 52, 53 for the process gas, the silicon-based intermediate and the silicon precursor compound. It is within the scope of the invention for more than three separate subconduits to be located downstream of the recovery unit, especially in order to recirculate other gases, for example hydrogen chloride, separately. The respective mass or volume flows are determined by separate measuring units 31, 32, 33 which are arranged on the subconduits 51, 52, 53 downstream of the recovery unit 7. The molar ratio of the silicon-based intermediate to the silicon precursor compound can be derived therefrom. As can be seen from FIG. 3, the recovered process gas is then fed to the fluid feed conduit 14, the silicon-based intermediate and the silicon precursor compound are the fluid feed conduit 13.

The invention claimed is:

1. A process for the continuous vapor deposition of silicon on substrates, comprising the following steps:
   (a) introducing at least one substrate into a reaction chamber;
   (b) introducing a process gas and also at least one gaseous silicon precursor compound into the reaction chamber;
   (c) forming a gaseous mixture of at least one silicon-based intermediate in coexistence with the gaseous silicon precursor compound and the process gas in the reaction chamber;
   (d) forming a silicon layer by vapor deposition of silicon from at least one of the gaseous silicon precursor compound or from the silicon-based intermediate on the substrate;
   (e) discharging an excess of the gaseous mixture from the reaction chamber into a circulation conduit; and
   (f) recirculating at least one constituent of the excess of the gaseous mixture selected from at least one of the silicon precursor compound, the silicon-based intermediate, or the process gas through the circulation conduit and into the reaction chamber;
   wherein regulation and introduction of the gaseous silicon precursor compound from the circulation conduit and into the reaction chamber is controlled such that a molar ratio of the silicon-based intermediate to the silicon precursor compound has a value of from 0.2:0.8 to 0.5:0.5, and the corresponding molar ratio of the silicon-based intermediate product to the silicon precursor compound is adjusted within a gas stream flowing from the circulation conduit into the reaction chamber.

2. The process as claimed in claim 1, further comprising determining the molar ratio of the silicon-based intermediate and the silicon precursor compound in the excess of the gaseous mixture in step (f) using a measuring unit.

3. The process as claimed in claim 2, further comprising transmitting the molar ratio of the silicon-based intermediate to the silicon precursor compound determined by the measuring unit to a control unit which regulates the introduction of the silicon precursor compound such that the molar ratio of the silicon-based intermediate to the silicon precursor compound has a value of from 0.2:0.8 to 0.5:0.5 in the process gas.

4. The process as claimed in claim 1, further comprising freeing or partially separating the excess of the gaseous mixture in step (f) of impurities using by a recovery unit.

5. The process as claimed in claim 4, wherein at least one of the silicon-based intermediate, the silicon precursor compound, or the process gas are recirculated via the circulation conduit into the reaction chamber in step (f).

6. The process as claimed in claim 1, wherein the silicon precursor compound is a chlorosilane.

7. The process as claimed in claim 1, wherein the process gas is hydrogen.

8. The process as claimed in claim 1, wherein the silicon-based intermediate is a chlorosilan.

9. The process as claimed in claim 1, wherein a total amount of the silicon precursor compound and the silicon-based intermediate in step (c) is present in a molar ratio of from 1 to 10 mol % in the process gas.

10. The process as claimed in claim 1, wherein formation of a silicon layer by vapor deposition of silicon from at least one of the silicon precursor compound or the silicon-based intermediate on the substrate takes place at a pressure of from 0.8 to 1.2 bar in the reaction chamber.

11. The process as claimed in claim 1, further comprising heating at least the substrate in the reaction chamber to a temperature of from 700° C. to 1400° C.

* * * * *